United States Patent [19]
Speake et al.

[11] Patent Number: 5,953,643
[45] Date of Patent: Sep. 14, 1999

[54] RECEIVER CIRCUIT

[75] Inventors: John D. Speake; Anthony H. Richards, both of Cambridge, United Kingdom

[73] Assignee: U.S. Philips Corporation, New York, N.Y.

[21] Appl. No.: 08/730,686

[22] Filed: Oct. 11, 1996

[30] Foreign Application Priority Data

Oct. 11, 1995 [GB] United Kingdom ............... 9520759
Aug. 20, 1996 [GB] United Kingdom ............... 9617423

[51] Int. Cl.$^6$ ........................................ H04B 1/26
[52] U.S. Cl. ........................................ 455/324; 375/319
[58] Field of Search ........................ 370/203, 209, 370/210, 441, 311; 375/319, 208, 316, 326, 349, 344, 345; 455/209, 343, 208, 324, 182.1, 183.1, 313, 314

[56] References Cited

U.S. PATENT DOCUMENTS

| | | | |
|---|---|---|---|
| 5,003,621 | 3/1991 | Gailus | 455/209 |
| 5,093,930 | 3/1992 | Kasperovitz | 455/45 |
| 5,422,889 | 6/1995 | Sevenhans et al. | 370/442 |
| 5,552,749 | 9/1996 | Nowatshi et al. | 375/344 |
| 5,557,642 | 9/1996 | Williams | 375/316 |
| 5,678,227 | 10/1997 | Connell et al. | 370/311 |
| 5,691,974 | 11/1997 | Zehavi et al. | 370/203 |
| 5,715,281 | 2/1998 | Bly et al. | 375/344 |
| 5,736,840 | 4/1998 | Otaka et al. | 323/217 |
| 5,761,615 | 6/1998 | Jaffee | 455/314 |

FOREIGN PATENT DOCUMENTS

| | | |
|---|---|---|
| 0344467B1 | 12/1989 | European Pat. Off. . |
| 0523779A1 | 1/1993 | European Pat. Off. . |
| 0599409 | 6/1994 | European Pat. Off. . |

OTHER PUBLICATIONS

Philips Journal of Research, vol. 41, No. 3, 1986, pp. 219–231, "Some Features of Signal Demodulation Resulting from the Practical Implementation of a Direct Conversion Radio Receiver", by R.A. Brown, R.J. Dewey and C.J. Collier.

Wayne Tomasi, Electronic Communications Systems Fundamental, Prentice–Hall, p. 145, 1994.

Primary Examiner—Huy D. Vu
Assistant Examiner—Chiho Andrew Lee
Attorney, Agent, or Firm—Jack D. Slobod

[57] ABSTRACT

A receiver circuit, particularly an integrated, zero IF receiver circuit in which a direct conversion IF stage is separated from an antenna by a further fequency conversion stage which is AC coupled to the direct conversion IF stage. A single crystal oscillator generates a frequency which is multiplied prior to being applied as a local oscillator signal to the further frequency conversion stage and is used to produce another frequency, which is divided to block harmonics, prior to being applied as quadrature related local oscillator signals to the direct conversion IF stage. The direct coversion IF stage includes several dc nulling for compensating for dc offsets.

8 Claims, 5 Drawing Sheets

RECEIVER CIRCUIT

TECHNICAL FIELD

The present invention relates to receiver circuit, particularly but not exclusively, a low power consuming receiver for use in applications such as digital paging.

BACKGROUND ART

The Philips Journal of Research, Vol 41, No. 3, 1986, pages 219–231 contains an article entitled "Some Features of Signal Demodulation Resulting from the Practical Implementation of a Direct Conversion Radio Receiver" by R A Brown, R J Dewey and C J Collier. The article states that a zero IF radio receiver architecture is suitable for VLSI integration and as a digitally implemented radio. Further it states that the direct conversion receiver has many advantages over the superheterodyne architecture and has been a great success for SSB reception. The article considers the extension of the direct conversion architecture to the reception of AM and FM signals. It shows that the ac coupling required to block unwanted dc components at the mixer outputs can degrade the subsequent demodulation of both AM and FM but that this can be successfully overcome by adjustment of the receiver local oscillator frequency.

In spite of this remark, the problem of dc offsets in direct conversion receivers still prevails. Sources of dc offsets are present in all stages of a receiver due to imbalances and tolerances in the integrated components and when the dc offsets are amplified, later stages in the receiver architecture are driven into saturation. A further source of dc offsets is the unavoidable reception of the local oscillator signal. This unavoidable reception of the local oscillator signal occurs by way of several simultaneous paths such as (i) direct leakage from the local oscillator part of the mixer to the signal input port, (ii) radiation from the local oscillator circuits to the antenna, and (iii) conducted local oscillator signals from the mixers via the RF amplifier to the antenna and back into the mixer. As these paths include the antenna, they are subject to variations during normal use of the pager resulting in a time variable dc output at the outputs of the mixers.

Using dc blocks to prevent dc offsets gives the familiar "hole-in-the-middle" response due to their high pass filter response and also means that the receiver will have a long settling time when subjected to large amplitude steps. DC blocks also apply a limitation to the receiver offset performance.

DISCLOSURE OF INVENTION

An object of the present invention to reduce the effects of dc offsets on direct conversion receivers.

According to the present invention there is provided a receiver having a signal input, a direct conversion IF stage, a further frequency conversion stage having an input coupled to the signal input and an output a.c. coupled to an input of the direct conversion IF stage.

The present invention is based on the recognition of the fact that by providing a frequency conversion stage between the antenna (or signal input) and the direct conversion IF stage, the direct conversion IF stage is isolated from antenna influenced variable dc offsets.

The ac coupling may be provided by band pass coupling means. The direct conversion stage does not have an unwanted image frequency response allowing a broadband coupling network between the further frequency conversion stage and the direct conversion IF stage.

The receiver may comprise a local oscillator signal generating means comprising an oscillator, first means coupled to the oscillator for providing a local oscillator frequency to the further frequency conversion stage and second means coupled to the oscillator for providing a local oscillator frequency to the direct conversion IF stage.

If desired the second means may comprise a frequency synthesiser, said oscillator output being used as a reference frequency. By using a frequency synthesiser it is possible to use the wide bandwidth of the further frequency conversion stage which allows multi-channel operation. The frequency synthesiser can be used to provide any frequency which is required to recover the desired channel as zero IF signals. Using the frequency synthesiser to generate the lower of the local oscillator signals gives a lower power consumption compared to generating the higher of the local oscillator signals. Additionally the use of a frequency synthesiser will permit roaming of the receiver through a cellular type of system in which no two adjacent cells operate on the same frequency channel and enable rapid retuning of the receiver.

The first and second means may include a quadrature divider for dividing the oscillator frequency and providing quadrature related outputs which are directly usable as local oscillator signals in the mixers of the direct conversion IF stage. The inclusion of a divider, irrespective of whether or not it is implemented as a quadrature divider for the second means, avoids a potential problem of unwanted harmonics of the crystal frequency being equal to the signal frequency at the antenna so that a spurious output at the IF frequency will be generated by the mixer in the further frequency conversion stage. The amplitude and phase of this unwanted IF signal can be antenna influenced and may cause dc offsets at the outputs of the mixers of the direct conversion IF stage. The divider ensures that an unwanted harmonic of the crystal frequency cannot be the same as the signal frequency and can be configured to provide a quadrature local oscillator drive for the mixers of the direct conversion IF stage without requiring off-chip components in the signal path.

In an embodiment of the present invention the direct conversion IF stage includes dc nulling means which do not require dc blocking stages. To effect dc nulling, either the input signal to, or the first multiple of the local oscillator frequency to, the further frequency conversion stage is inhibited whilst the dc nulling means are activated to apply a dc correction signal or signals to counter any dc offsets measured and thereafter, the inhibiting is removed and the input signal is processed normally. Nulling introduces the correction necessary to make the output dc operating point of all stages equal to a defined reference. This correction may be carried out at regular intervals, compatible with the protocol being used, for example during reception of preamble or sync code words containing no useful information to the receiving circuit.

BRIEF DESCRIPTION OF DRAWINGS

The present invention will now be described, by way of example, with reference to the accompanying drawings, wherein.

In the drawings the same reference numerals have been used to indicate corresponding features.

MODES FOR CARRYING OUT THE INVENTION

Figure 1:
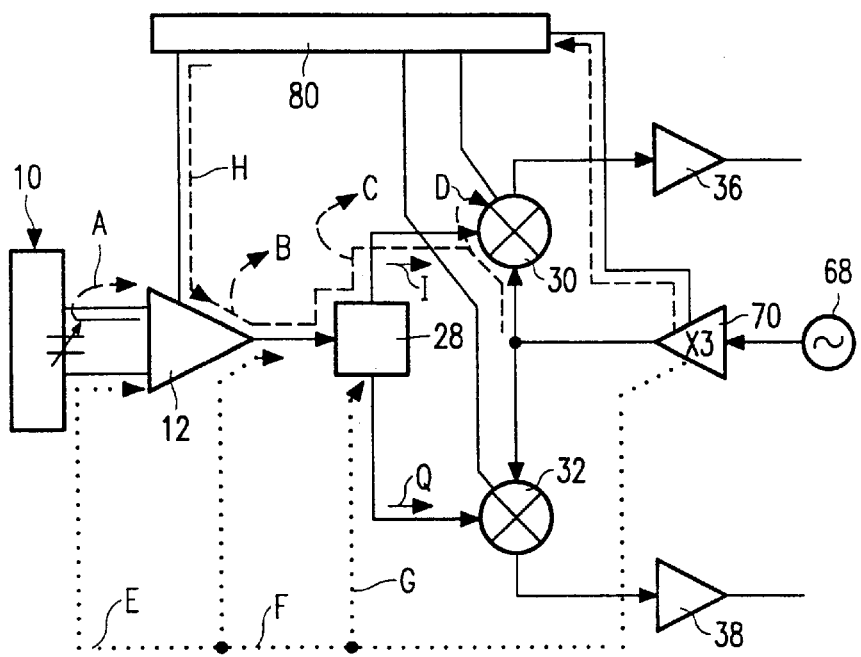
FIG. 1 is a block schematic diagram of the front end of a conventional direct conversion receiver showing leakage paths of the local oscillator (LO) port signal onto the RF port, the dotted lines representing radiation paths and the broken lines representing the conducted paths.

Referring to FIG. 1, the front end of a conventional direct conversion receiver comprises a loop antenna 10 with its associated tuning capacitor coupled between inputs of an RF amplifier 12. An output of the amplifier 12 is coupled to a quadrature phase splitter 28. An in-phase output I of the phase splitter 28 is coupled to a first input of a mixer 30 and a quadrature phase output Q is coupled to a first input of a mixer 32. A local oscillator 68 is coupled to a frequency tripler 70, an output of which is coupled to second inputs of the mixers 30,32. The frequency supplied to the second inputs is such as to mix the received signal down to a zero IF. A biasing arrangement 80 is coupled to the RF amplifier 12, the mixers 30,32 and the frequency tripler 70. Outputs of the mixers 30,32 are coupled to post mixer amplifiers 36,38 respectively.

FIG. 1 also shows the various leakage paths of the local oscillator (LO) signal onto the RF port. The dotted lines show paths E,F,G which include radiation leakage and the broken lines show paths A,B,C,D,H which are purely conducted.

Figure 2:
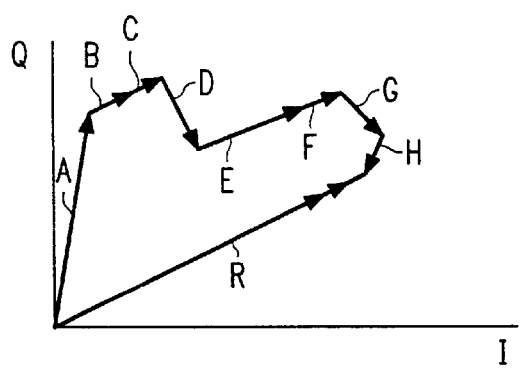
FIG. 2 is an I-Q diagram at the post mixer amplifier output.

FIG. 2 is an I-Q diagram of the post mixer amplifier output and shows the effect of each individual leakage path A to H as a vector component of the resultant (or overall) dc offset R. The dominant vector components of the overall resultant vector R are:

Path A, conduction across the mixer junction through the phase splitter 28 and RF amplifier 12 to the antenna 10 and then reflection back through the RF amplifier 12 and phase splitter 28.

Path B, conduction across the mixer junction through the phase splitter 28 to the RF amplifier 12 and then reflection back through the phase splitter 28.

Path C, conduction across the mixer junction to the phase splitter 28 and the reflection back.

Path D, conduction directly across the mixer semiconductor junctions.

Path E, radiation from the unscreened tripler 70 output to the antenna input and then through the RF amplifier 12 and the phase splitter 28.

The other paths F, G and H are generally much smaller. Paths F and G are radiation leakage paths onto the output of the RF amplifier 12 tuned circuit and the phase splitter 28, respectively. Conduction via the path H through the bias lines is generally small because the bias lines are well decoupled.

The paths B,C,D are likely to be time invariant whereas paths A and E will vary due to movement of objects which disturb the antenna field.

Figure 3:
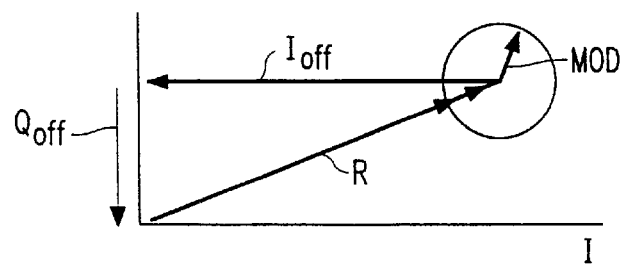
FIG. 3 is an I-Q diagram at the stage following the post mixer amplifier output showing the vector addition of the variable leakage components.

FIG. 3 is an I-Q diagram measured at the outputs of the post mixer amplifiers 36, 38 showing the resultant dc offset vector R and includes a circle formed by a rotating vector representing the modulation MOD of a wanted signal. The radius of the circle represents the received signal amplitude. In FIG. 3, $I_{OFF}$ and $Q_{OFF}$ represent the I and Q channel dc correction voltages which have to be applied following the post mixer amplifiers 36,38 to null the offsets.

Figure 4:
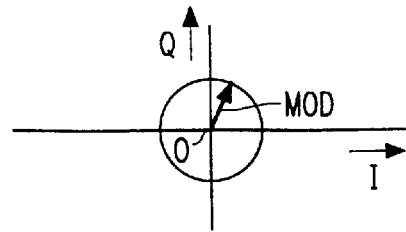
FIG. 4 is an I-Q diagram showing the result of dc nulling.

FIG. 4 is an I-Q diagram showing the effect of nulling. The rotating vector MOD is now centred on the origin O. This centering of the wanted modulation about the origin O is essential if the signal is to be correctly received. It is only then that a signal can be amplified in a receiver and retain its information. If the resultant dc component $I_{OFF}$ or $Q_{OFF}$ alter in amplitude or phase, or both, so that the circle no longer includes the origin O within itself, signal reception will be lost and will not be re-established until a dc nulling circuit (not shown in FIG. 1) is reset.

From experimental evidence it can be shown that the two dominant causes of changes of dc offsets in a zero IF receiver are radiation of LO signals to the antenna 10, path E, and conducted LO signals to the antenna, path A.

Figure 5:
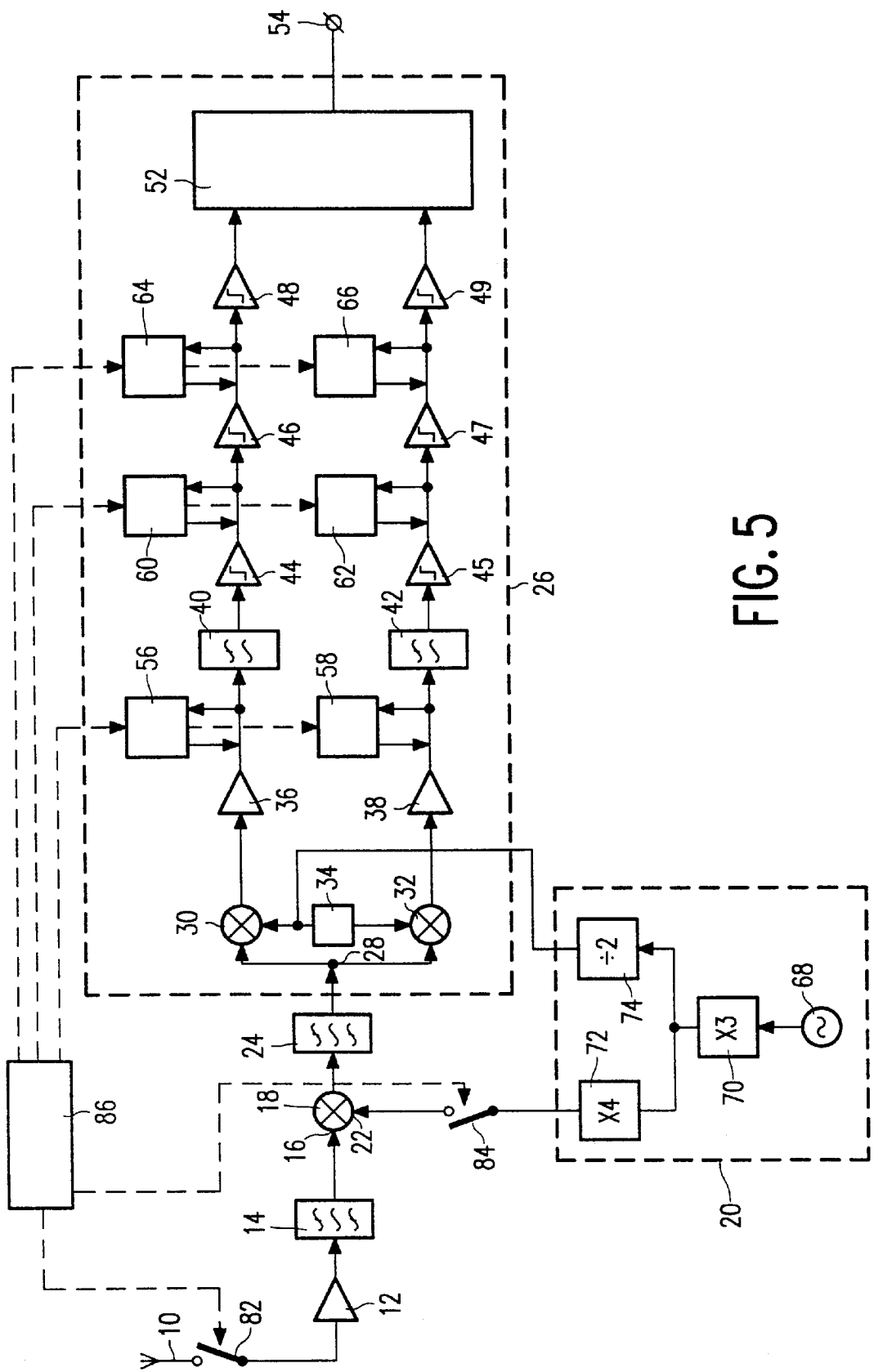
FIG. 5 is a block schematic diagram showing one embodiment of a receiver made in accordance with the present invention.

In order to reduce these effects in a low cost receiver made in accordance with the present invention and as shown in FIG. 5, an additional frequency conversion process based on a mixer 18 is provided to isolate the direct conversion IF stage 26 from antenna influenced variable dc offsets. An ac coupling comprising the band pass filter (or high pass filter) 24 can be used between the output of the additional frequency conversion process and the input to the direct conversion IF stage 26 in order to isolate antenna influenced dc offsets at the output of the mixer 18 from subsequent stages. If desired a high pass filter (not shown) may be used in place of the band pass filter 24. DC nulling is also applied in the direct conversion IF stage. Another feature of the circuit shown in FIG. 5 is the use of a single local oscillator 68 to supply the LO signals to the respective frequency conversion stages.

Referring to FIG. 5 in greater detail, the receiver comprises an antenna 10 which is coupled by way of an RF amplifier 12 to a band pass filter 14 which selects the band of frequencies of interest. An output of the filter is coupled to a first input 16 of a mixer 18. A local oscillator signal from a local oscillator signal generator 20 is applied to a second input 22 of the mixer 18. The output from the mixer 18 is an IF signal which is filtered in a band pass or high pass filter 24 to provide a broad band signal which is applied to a zero IF frequency down conversion and demodulating stage 26. The output from the band pass filter 24 is applied to a junction 28 whereat the signal is split into two paths and applied to first inputs of mixers 30 and 32. An output of the local oscillator signal generator 20 is applied to a second input of the mixer 32 by way of a 90° phase shifter 34, and to a second input of the mixer 30. The local oscillator frequency applied to the mixers 30,32 is such as to mix a wanted signal in the broad band IF signal from the band pass filter 24 down to a zero IF. Post mixer amplifiers 36, 38 are connected to the outputs of the mixers 30,32, respectively. The outputs from the amplifiers 36,38 are directly connected to low pass filters 40,42 which pass the wanted products of mixing. First limiting amplifiers 44,45 are directly connected to the outputs of the low pass filters 40,42, respectively, and the outputs of first limiting amplifiers 44,45 are directly connected to second limiting amplifiers 46, 47, respectively. Outputs of the second limiting amplifiers 46, 47 are connected to inputs of third limiting amplifiers 48, 49. A demodulator 52 is connected to outputs of the third limiting amplifiers 48,49 and provides an output on the terminal 54.

DC nulling circuits 56,58 are coupled to the respective signal paths between the amplifiers 36,38 and the low pass filters 40,42. DC nulling circuits 60,62 are connected to the respective signal paths between the outputs of the first limiting amplifiers 44,45 and the second limiting amplifiers 46,47. Finally dc nulling circuits 64,66 are connected to the respective signal paths between the outputs of the second limiting amplifiers 46,47 and respective inputs to the third limiting amplifiers 48, 49.

Figure 8:
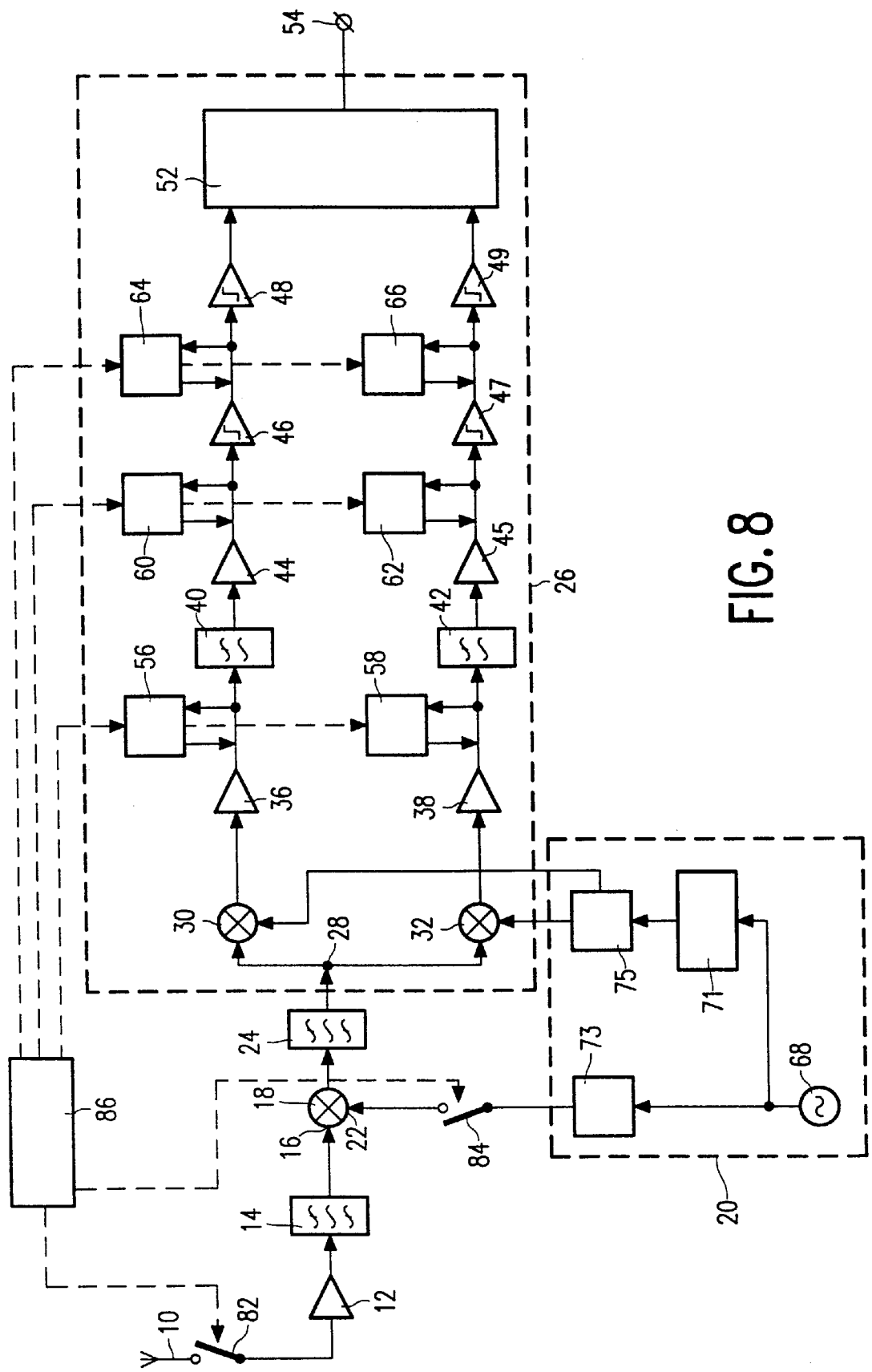
FIG. 8 is a block schematic diagram showing another embodiment of a receiver made in accordance with the present invention.

The signal generating means 20 comprises a crystal controlled oscillator 68, the output from which is multiplied by an odd number multiple, for example 3, in a multiplier 70. In order to provide the local oscillator frequency to the input 22 of the mixer 18, the output of the multiplier 70 is multiplied in multiplier 72 by an appropriate multiple, for example by 4, to optimise the first IF to ease subsequent filtering. However, in order to provide the local oscillator signal to the mixers 30,32, the output of the multiplier 70 is divided by 2 in a divider circuit 74. By dividing down the frequency from the multiplier 70, harmonics of the crystal oscillator frequency no longer coincide with the wanted signal frequency. Optionally the divider 74 and the phase shifter 34 may be replaced by an on-chip quadrature divider as shown in FIG. 8.

Figure 6A:
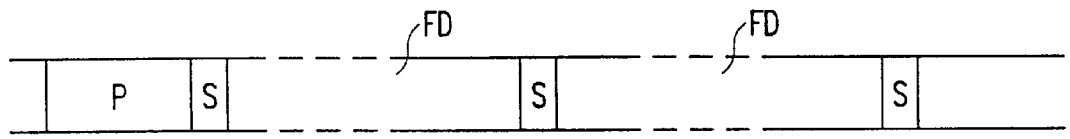
FIGS. 6A, 6B, 6C and 6D are waveform diagrams explaining the dc nulling technique employed in the receiver shown in FIG. 5.

Referring to FIG. 6A the signal received by the antenna comprises a preamble P which is followed by a synchronisation code word S which is concatenated with frames of data FD which may have the same bit rate as, or a different bit rate from, that used to transmit the synchronisation code word. As shown in FIG. 6A the synchronisation code word S and the frames of data repeat successively.

In order to effect dc nulling using the nulling circuits 56,58,60,62,64 and 66 the receiver is energised to allow the crystal oscillator 68 and the remainder of the receiver to settle.

The nulling operation requires the incoming signal received at the antenna 10 to be either attenuated or removed completely and this may be effected by attenuating the signal path between the output of the antenna 10 and the first input 16 to the mixer 18 and/or interrupting the local oscillator path between the input of the multiplier 72 and the second input 22 of the mixer 18. For convenience of illustration the means for interrupting the signal path from the antenna has been shown as a switch 82, but other methods may be used such as reducing the gain of the amplifier 12, and the means for interrupting the local oscillator path has been shown as a switch 84, but other methods may be used. Control means 86 are provided for actuating the switch 82 and/or 84 as well as the dc nulling circuits 56,58,60,62,64 and 66, as required.

The nulling process is a sequential one and with the input signal attenuated or interrupted, the dc offsets at the outputs of the post mixer amplifiers 36,38 are measured by the circuits 56,58 and dc correction signals equal to, but of opposite polarity to, the dc offsets measured are applied to the respective signal paths at the outputs of the post mixer amplifiers 36,38. The effects of this dc correction will transfer down the zero IF signal paths. The dc offset at the outputs of the first limiting amplifiers 44,45 are then measured by the dc nulling circuits 60,62 and dc correction signals equal to, but of opposite polarity to, the dc offsets measured are applied to the respective outputs of the first limiting amplifiers 44,45. Once again the effect of this correction transfers down the signal path. Lastly, the dc offsets at the outputs of the second limiting amplifiers 46,47 are measured by the dc nulling circuits 64,66 and dc correction signals equal to, and of opposite polarity to, the offset measured are applied to the respective outputs of the second limiting amplifiers 46,47. The receiver is deemed to have been nulled and the received signal is now reintroduced into the signal channel by either or both removing the attenuation in the RF amplifier path or reintroducing the local oscillator injection to the mixer 18. The dc nulling circuits 56,58,60,62,64 and 66 include storage means which maintain the required dc correction signals until the measurement cycle is repeated.

Figure 6B:
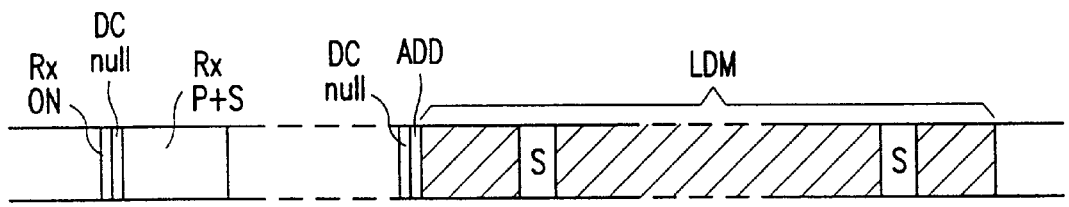
Figure 6C:

FIG. 6B illustrates an example of a long data message LDM transmission which is indicated by the cross hatched lines. FIG. 6B commences with the receiver switching on, Rx ON, to allow the circuitry to settle. This is immediately followed by a dc nulling operation, DC null, of the type described above. When the signal is restored, the pager is receiving the preamble and the concatenated sync code word, Rx P&S. After that, the receiver section of the pager is powered down as part of the normal battery conservation protocol. Just prior to the predetermined frame when the pager will receive an address ADD which may be transmitted to it, the receiver section is re-energised and goes through a dc nulling routine, DC null. In the case of FIG. 6B since a long data message LDM is concatenated with the address and this message extends through the entire next following batch and partially into the batch after that the pager remains energised Rx ON, as shown in FIG. 6C, to receive not only the data but also the sync code words which are present. FIG. 6C also shows when the receiver is de-energised Rx OFF. For some pagers it is not necessary to receive sync code words S in long data messages, LDMs, so these periods can be used to re-null the receiver against drift effects such as temperature or battery supply changes. Following the termination of the long data message the pager turns off and then resumes its normal operation of powering up to receive the sync code words and for the duration of its predetermined frame. Each time dc nulling occurs in the manner described above.

Figure 6D:
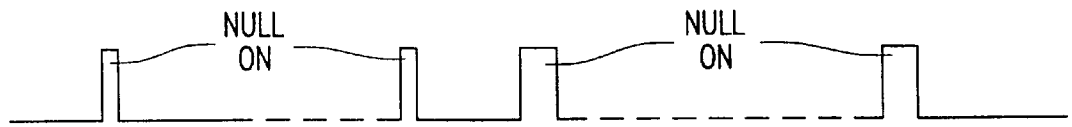

FIG. 6D illustrates the time periods, NULL ON, in which dc nulling takes place in the example shown in FIG. 6B.

Figure 7:
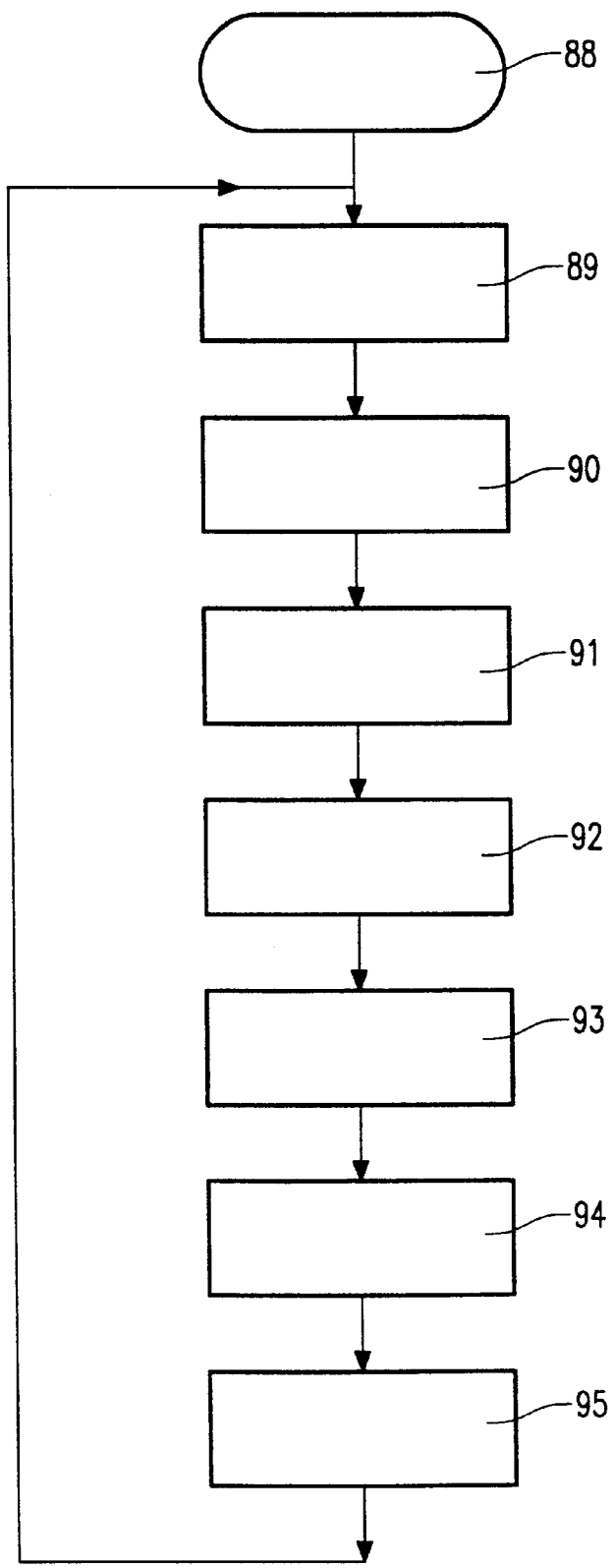
FIG. 7 is a flow chart illustrating the sequence of steps involved in the dc nulling operation.

Referring to FIG. 7, the flow chart commences with a start block 88 denoting switching the receiver on and proceeds to a block 89 which denotes initiating the nulling cycle. Block 90 denotes the control means 86 actuating the switch(es) 82 and/or 84 to inhibit the first frequency conversion stage. In the block 91, the control means actuate the nulling means 56,58, each of which measures the dc offset in its respective path and applies an equal and opposite dc correction signal to the circuit paths at the outputs of the post mixer amplifiers 36,38. This dc correction signal is maintained after the nulling means has been de-activated. A time delay ensues to allow the effects of the correction to propagate through the receiver to the next dc nulling stage. In the block 92, the nulling means 60,62 are actuated by the control means 86 and the previously described cycle is repeated and the nulling means 60,62 are de-activated. In block 93, the control means 86 actuates the nulling means 64,66 and the previously described cycle is repeated and the nulling means 64,66 are de-activated.

If there were any more pairs of nulling stages then the cycle would be repeated with the last pair being that closest to the demodulator 52.

Once all the pairs of nulling stages have been actuated/de-actuated in sequence, then in block 94 the inhibition on the first frequency conversion stage is removed by closing the switch 82 and/or 84, as appropriate. The receiver is now operating normally as indicated by block 95 until the next opportunity to null. Thereafter the flow chart reverts to the block 89.

FIG. 8 illustrates a second embodiment of the invention which is a variant of the first embodiment shown in FIG. 5. As the basic receiver circuit and its operation are substantially unchanged then in the interests of brevity the following description will be directed to the features of difference which are primarily concerned with the generation of the local oscillator signals for the mixers 18, 30 and 32.

The local oscillator signal generation circuit 20 comprises a crystal oscillator 68 the output of which is coupled to a frequency synthesiser 71 and to a frequency multiplier 73 which provides the local oscillator signal to the second input 22 of the mixer 18. The frequency synthesiser 71, which may be of a phase locked loop type known in the art, supplies a lower output frequency than the output of the multiplier 73 to a quadrature divider 75 which simultaneously divides the frequency, for example by 2, and produces quadrature related outputs which are coupled directly to the mixers 30, 32.

Using a frequency synthesiser 71 is of particular value when the receiver is operating in a multi-channel system because it enables the filter 24 to have a broad pass band, for example 1 MHz, which permits all the channels in the system to be passed and the division ratio applied to the frequency synthesiser 71 enables the quadrature divided down frequency to be used to mix the desired signal down to a zero IF. An advantage of using a frequency synthesiser to produce the lower local oscillator frequency up to a maximum of 200 MHz rather than the higher local oscillator frequency is that it is more economical on current consumption.

The quadrature divider 75 is readily integrable as part of a zero IF receiver, blocks unwanted harmonics and produces directly usable quadrature outputs. Additionally it is able to operate over several octaves.

The features of the first and second embodiments are not mutually exclusive and features from one embodiment can be used in the other and vice versa. In particular the frequency synthesiser may be used to generate the first local oscillator frequency applied to the second input 22 of the mixer 18. Further each frequency conversion stage may have its own multiple frequency synthesiser or single frequency phase locked loop.

From reading the present disclosure, other modifications will be apparent to persons skilled in the art. Such modifications may involve other features which are already known in the design, manufacture and use of zero IF receivers, and component parts thereof and which may be used instead of or in addition to features already disclosed herein. Although claims have been formulated in this application to particular combinations of features, it should be understood that the scope of the disclosure of the present application includes any and every novel feature or combination of features disclosed herein either explicitly or implicitly and together with all such modifications and variations, whether or not relating to the main inventive concepts disclosed herein and whether or not it mitigates any or all of the same technical problems as the main inventive concepts. The applicants hereby give notice that patent claims may be formulated to such features and/or combinations of such features during prosecution of the present application or of any further application derived or claiming priority therefrom.

Industrial Applicability

Low powered radio receiver circuits used in wide area digital pagers.

We claim:

1. A receiver circuit comprising, in combination,
   (a) a signal input,
   (b) a superheterodyne stage coupled to the signal input,
   (c) a direct conversion stage having quadrature related signal paths,
   (d) ac coupling means coupling an output of the superheterodyne stage to an input of the direct conversion stage,
   (e) demodulating means coupled to the direct conversion stage,
   (f) local oscillator signal generating means comprising a single oscillator having an output frequency different from the local oscillator frequencies required by each of the superheterodyne stage and the direct conversion stage,
   (g) means for producing the local oscillator frequency for the superheterodyne stage from said output frequency,
   (h) means, including a frequency divider, for producing quadrature related local oscillator signals for the direct conversion stage from said output frequency, and
   (i) at least one dc nulling stage in each of the quadrature related signal paths of the direct conversion stage, the at least one dc nulling stage including means for measuring the dc offset in the signal path to which it is connected and for applying a substantially equal and opposite dc correction to the signal path.

2. A receiver circuit as claimed in claim 1, further comprising signal inhibiting means and control means for activating the signal inhibiting means to prevent a signal from being applied to the direct conversion stage when the dc nulling means has been activated.

3. A receiver circuit as claimed in claim 1, wherein the quadrature related signal paths each comprise at least two series connected limiting amplifier stages, and wherein a dc nulling stage is coupled to the signal path to each of the respective limiting amplifier stages.

4. A receiver circuit as claimed in claim 3, further comprising control means for controlling the activation of the dc nulling stages such that dc nulling is effected sequentially commencing with the dc nulling stages nearest the input of the direct conversion stage.

5. A receiver circuit as claimed in claim 4, further comprising inhibiting means responsive to control signals from the control means to inhibit the application of a signal to the input of the direct conversion stage during dc nulling by said dc nulling stages.

6. A receiver circuit as claimed in claim 1, further comprising frequency multiplying means coupled to the single oscillator for providing the local oscillator frequency for the superheterodyne stage.

7. A receiver circuit as claimed in claim 1, wherein the means for producing the local oscillator signal for the direct conversion stage includes a frequency synthesizer, and wherein the single oscillator comprises a reference frequency source.

8. A receiver circuit as claimed in claim 1, wherein each of the quadrature related signal paths includes a frequency conversion stage and filtering means and wherein the at least one nulling stage is coupled between the frequency conversion stage and the filtering means.

* * * * *